(12) United States Patent
Yilmaz (10) Patent No.: US 11,811,420 B2
(45) Date of Patent: Nov. 7, 2023

(54) DIGITAL-TO-ANALOG CONVERTER WITH CASCADED LEAST SIGNIFICANT BIT (LSB) INTERPOLATOR CIRCUIT

(71) Applicant: Texas Instruments Incorporated, Dallas, TX (US)

(72) Inventor: Abdullah Yilmaz, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/581,516

(22) Filed: Jan. 21, 2022

(65) Prior Publication Data

US 2023/0238980 A1    Jul. 27, 2023

(51) Int. Cl.
H03M 1/66    (2006.01)

(52) U.S. Cl.
CPC .................................. H03M 1/661 (2013.01)

(58) Field of Classification Search
CPC ............................... H03M 1/66; H03M 1/661
See application file for complete search history.

(56) References Cited

U.S. PATENT DOCUMENTS

| | | | | |
|---|---|---|---|---|
| 3,676,839 A * | 7/1972 | Wohl | .................... | G10K 11/345 367/122 |
| 4,292,668 A * | 9/1981 | Miller | .................... | G06F 13/285 710/22 |
| 4,293,908 A * | 10/1981 | Bradley | ................ | G06F 13/282 710/22 |
| 4,300,193 A * | 11/1981 | Bradley | ................ | G06F 13/282 710/22 |
| 4,300,194 A * | 11/1981 | Bradley | ................ | G06F 13/362 710/306 |
| 4,317,169 A * | 2/1982 | Panepinto, Jr. | ........ | G11C 11/406 365/222 |
| 4,321,665 A * | 3/1982 | Shen | .................... | G06F 13/4013 712/30 |
| 4,340,933 A * | 7/1982 | Miu | ........................ | G06F 13/362 711/E12.089 |
| 4,383,295 A * | 5/1983 | Miller | .................... | G06F 3/0227 715/201 |
| 4,387,423 A * | 6/1983 | King | ..................... | G06F 11/3648 714/34 |
| 4,459,665 A * | 7/1984 | Miu | ....................... | G06F 13/362 710/113 |

(Continued)

OTHER PUBLICATIONS

International Search Report and Written Opinion in corresponding PCT Application No. PCT/US2023/060813, dated May 19, 2023.

*Primary Examiner* — Lam T Mai
(74) *Attorney, Agent, or Firm* — Valerie M. Davis; Frank D. Cimino (57) ABSTRACT

A digital-to-analog converter (DAC) for converting a digital input word to an analog output signal includes a string DAC, a first interpolator and a second interpolator. The string DAC outputs a first voltage and a second voltage in response to M most significant bits of the digital input word. The first interpolator interpolates between the first and second voltages in response to middle Q least significant bits of the digital input word and provides a first interpolated voltage. The second interpolator interpolates between the first interpolated voltage and the second voltage in response to lower P least significant bits of the digital input word.

22 Claims, 4 Drawing Sheets

(56) References Cited

U.S. PATENT DOCUMENTS

| | | | |
|---|---|---|---|
| 4,484,271 A * | 11/1984 | Miu | G06F 9/268 |
| | | | 712/245 |
| 4,495,571 A * | 1/1985 | Staplin, Jr. | G06F 13/122 |
| | | | 710/113 |
| 5,396,245 A | 3/1995 | Rempfer | |
| 6,246,351 B1 | 6/2001 | Yilmaz | |
| 7,414,561 B1 | 8/2008 | Brubaker | |
| 10,608,849 B1 * | 3/2020 | Hormati | H04L 25/03885 |

* cited by examiner

DIGITAL-TO-ANALOG CONVERTER WITH CASCADED LEAST SIGNIFICANT BIT (LSB) INTERPOLATOR CIRCUIT

TECHNICAL FIELD

The disclosure generally relates to digital-to-analog converters (DACs), and more particularly to a DAC with cascaded least significant bit (LSB) interpolator circuits.

BACKGROUND

In a DAC, a plurality of resistors are connected in series between a high reference voltage and a low reference voltage. The voltages at nodes (tap points) between the series connected resistors are selectively switched to an output in response to a digital input. The voltages at the output are analog representations of the digital inputs. For an N-bit DAC, $2^N$ resistors are needed, forming $2^N+1$ nodes (tap points). For a 7-bit DAC, 128 resistors are needed, and for an 8-bit DAC 256 resistors are needed. Thus, the number of resistors is too large if a DAC has more than 7 bits.

One existing approach is to separate the DAC into a string DAC section and an interpolator DAC section. The string DAC section includes a plurality of series connected resistors, all of equal resistance. A pair of switches each constituting an upper and a lower switch is associated with each resistor. The lower terminal of each resistor is connected to a corresponding lower switch and the upper terminal of each resistor is connected to a corresponding upper switch. The digital input word is divided into an M most significant bit (MSB) subword and an N least significant bit (LSB) subword. The MSB subword is decoded to close one of the pairs of the switches associated with a selected resistor, thus providing a voltage (e.g., V1) at the lower terminal and a voltage (e.g., V2) at the upper terminal of the selected resistor. The voltage V1 at the lower terminal of the selected resistor is a coarse analog representation of the MSB subword. Because increasing the MSB subword increases V1 and decreasing the MSB subword decreases V1, the coarse analog representation (i.e., V1) is monotonic.

The voltage drop (V2−V1) across the selected resistor is provided as an input to the interpolator DAC section which includes $2^N$ pairs of transistors arranged in differential transconductance stages. The differential transconductance stages are voltage controlled current sources whose differential input voltages produce output currents. Each transistor in the differential transconductance stages receives identical current (sometimes referred to as "tail current"). The voltage drop (V2−V1) across the resistor is provided as an input to the differential transconductance stages, and the N-bit LSB subword is incremented to modulate the input offset voltages of the differential transconductance stages. As a result, the interpolator DAC section stage produces an output voltage, VOUT, which is a fine interpolation between V2 and V1. The sum (V1+VOUT) is the analog representation of the digital input word.

Although separating the DAC into a string DAC section and an interpolator DAC section reduces the total number of resistors in the string DAC section, this approach requires a large number of differential transconductance stages in the interpolator DAC section, which require a relatively large area in an integrated circuit.

SUMMARY

In one aspect, a digital-to-analog converter (DAC) for converting a digital input word to an analog output signal includes a string DAC which includes a plurality of series-connected resistors. The string DAC includes a most significant bit (MSB) switching circuit which includes pairs of switches. Each pair of switches includes an upper switch and a lower switch. Each upper switch is connected to an upper terminal of one of the plurality of series-connected resistors and each lower switch is connected to a lower terminal of one of the plurality of series-connected resistors. The MSB switching circuit provides a first voltage and a second voltage in response to an MSB control signal. The DAC includes a first least significant bit (LSB) interpolator coupled to the string DAC. The first LSB interpolator includes an output, a plurality of non-inverting inputs and a plurality of inverting inputs coupled to the output. One of the non-inverting inputs is coupled to receive the first voltage and the other non-inverting inputs are coupled to receive the first or the second voltage. The first LSB interpolator provides a first interpolated voltage at the output in response to a first LSB control signal. The DAC includes a second LSB interpolator coupled to the string DAC and the first LSB interpolator. The second LSB interpolator includes an output, a plurality of non-inverting inputs and a plurality of inverting inputs coupled to the output. One of the non-inverting inputs is coupled to receive the first interpolated voltage and the other non-inverting inputs are coupled to receive the first voltage or the second voltage. The second LSB interpolator provides an output voltage at the output in response to a second LSB control signal.

In an additional aspect, the string DAC includes a MSB decoder which has an input coupled to receive a MSB subword and provides the MSB control signal by decoding the MSB subword. The MSB subword includes M most significant bits of the digital input word, where M is an integer.

In an additional aspect, the first interpolator includes a first LSB decoder which has an input coupled to receive a first LSB subword and provides the first LSB control signal by decoding the first LSB subword. The first LSB subword includes lower P least significant bits of the digital input word.

In an additional aspect, the second interpolator includes a second LSB decoder which has an input coupled to receive a second LSB subword and provides the second LSB control signal by decoding the second LSB subword. The second LSB subword includes middle Q least significant bits of the digital input word.

In an additional aspect, a DAC for converting a digital input word to an analog output signal includes a first LSB interpolator circuit which includes a plurality of non-inverting inputs, and a plurality of inverting inputs coupled to an output. One of the non-inverting inputs is coupled to receive a coarse representation voltage, and the other non-inverting inputs are selectively coupled to receive the coarse representation voltage or a second voltage higher than the coarse representation voltage. The first LSB interpolator circuit provides a first interpolated voltage at the output. The DAC includes a second LSB interpolator circuit which includes a plurality of non-inverting inputs, and a plurality of inverting inputs coupled to an output. One of the non-inverting inputs is coupled to receive the first interpolated voltage, and the other non-inverting inputs are selectively coupled to receive the coarse representation voltage or the second voltage. The second LSB interpolator circuit provides an output voltage.

BRIEF DESCRIPTION OF THE DRAWINGS

The same reference numbers or other reference designators are used in the drawings to designate the same or similar (structurally and/or functionally) features.

DETAILED DESCRIPTION

Figure 1:
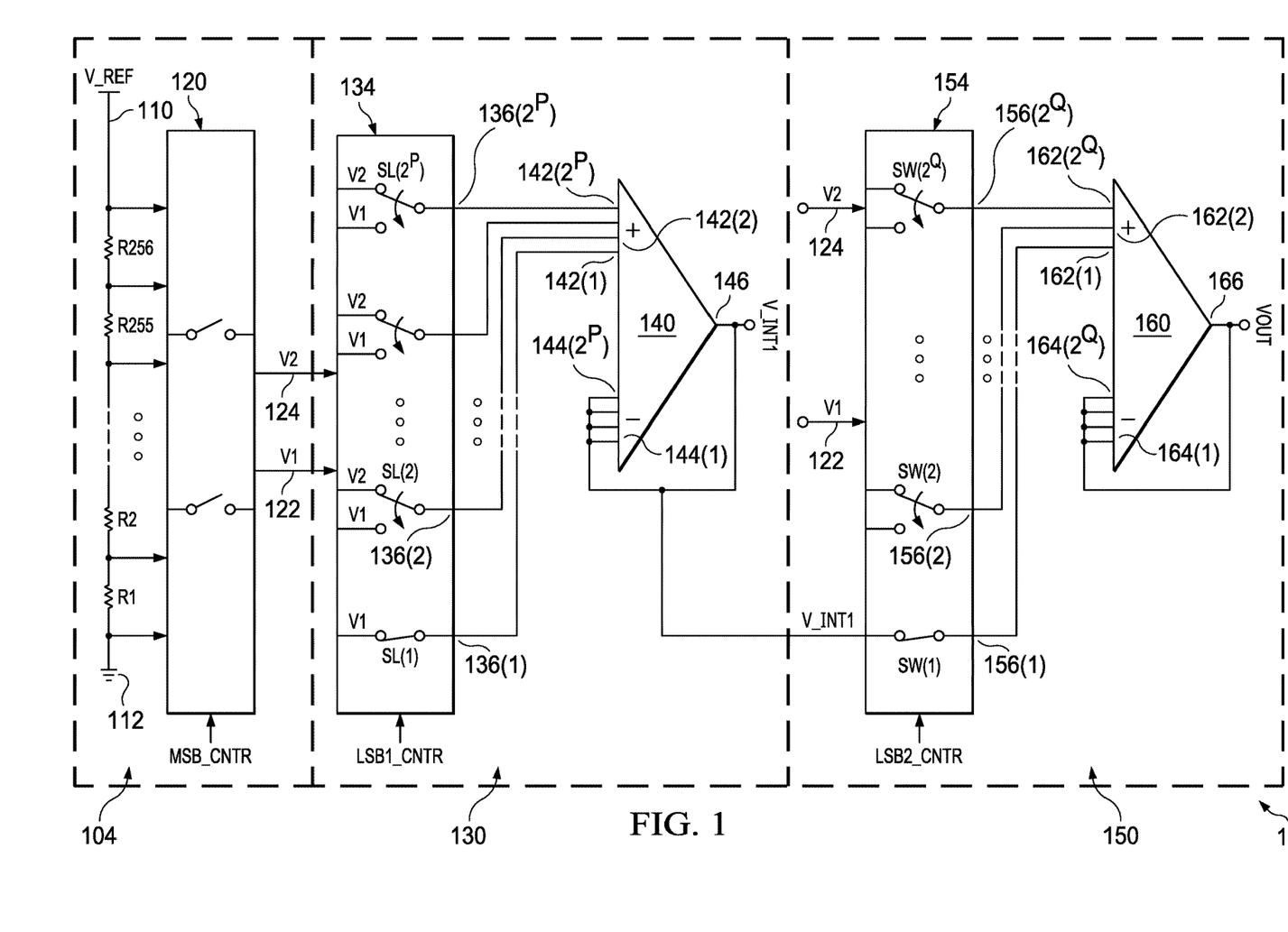
FIG. 1 is a block diagram of a digital-to-analog converter (DAC) of an example embodiment.

FIG. 1 is a block diagram of a digital-to-analog converter (DAC) 100 of an example embodiment. The DAC 100 converts a digital input D_IN (also referred to as "digital input word") to an analog output signal, VOUT. The digital input D_IN (not shown in FIG. 1) is divided into an M most significant bits MSB_SUB (shown in FIG. 2), a lower P least significant bits LSB_SUB1 (shown in FIG. 3), and a middle Q least significant bits LSB_SUB2 (shown in FIG. 4), which are used by the DAC 100 to generate the output signal VOUT.

The DAC 100 includes a string DAC section 104 which produces an output (V1 and/or V2), based on the M most significant bits of D_IN, which is a coarse representation of the digital input word D_IN. The string DAC section 104 includes a plurality of resistors (e.g., R1-RN, where N is 256 in the example shown in FIG. 1) connected in series between a reference voltage terminal 110 and a common potential (e.g., ground) terminal 112. To convert the M MSB's, $2^M$ resistors of equal resistance are connected in series between the reference voltage (V_REF) terminal 110 and the ground terminal 112. In the example of FIG. 1, 256 resistors (R1-R256) are connected in series to convert 8 bits. The reference voltage terminal 110 can be connected to a reference voltage V_REF and the ground terminal 112 can be connected to an electrical ground.

The string DAC section 104 includes an MSB switching circuit 120 which can be selectively coupled to the resistors (e.g., R1-R256). The MSB switching circuit 120 has first and second outputs 122 and 124, respectively. In response to an MSB control signal MSB_CNTR, the MSB switching circuit 120 selects one of the resistors and couples the lower terminal of the selected resistor to the first output 122 and couples the upper terminal of the selected resistor to the second output 124. As a result, voltage V1 at the lower terminal of the selected resistor is coupled to the first output 122, and voltage V2 at the upper terminal of the selected resistor is coupled to the second output 124. By varying the MSB control signal MSB_CNTR, any one of resistors (i.e., R1-R256) can be selected, and voltage V1 at the lower terminal of the selected resistor and voltage V2 at the upper terminal of the selected resistor can be accessed from the first and second outputs 122 and 124. In an example embodiment, MSB_CNTR is generated by decoding M most significant bits of D_IN. Because V1 is approximately close to the analog representation of the digital input word, V1 is referred to as a coarse representation of the digital input word. While switching circuit 120 is illustrated in FIG. 1 as including two switches, in other example embodiments, switching circuit 120 may include any number of switches (and/or other circuit elements) that are connected in series and/or parallel.

The DAC 100 includes a first LSB interpolator section 130 which interpolates between voltages V1 and V2 based on lower P LSB's of the digital input word D_IN. In addition, the DAC 100 includes a second LSB interpolator section 150 which interpolates between V2 and the output voltage generated by the first LSB interpolator section 130 based on middle Q LSB's of the digital input word D_IN. The first LSB interpolator section 130 includes a switching circuit 134 which has a plurality of switches, shown as switches SL(1)-SL($2^P$), having respective outputs 136(1)-136($2^P$). In the example illustrated in FIG. 1, the switch SL(1) connects to V1, thus V1 appears at an output 136(1). The remaining switches SL(2)-SL($2^P$) are arranged such that they can connect their respective outputs to either V2 or V1. For example, the switch SL(2) can connect to V2 in which case V2 appears at the output 136(2), or the switch SL(2) can connect to V1 in which case V1 appears at the output 136(2). The switch SL($2^P$) can connect to V2 in which case V2 appears at the output 136($2^P$), or the switch SL($2^P$) can couple to V1 in which case V1 appears at the output 136($2^P$).

The first interpolator section 130 includes a first interpolator circuit 140 which interpolates between voltages V2 and V1. The first interpolator circuit 140 includes a plurality of positive inputs 142(1)-142($2^P$), a plurality of negative inputs 144(1)-144($2^P$), and an output 146. The positive inputs 142(1)-142($2^P$) are coupled to the respective outputs 136(1)-136($2^P$) of the switching circuit 134, and the negative inputs 144(1)-144($2^P$) are coupled to the output 146. Because one of the switches (e.g., SL(1)) of the switching circuit 134 is coupled to V1, the positive input 142(1) receives V1. The other positive inputs 142(2)-142($2^P$) are coupled to either V1 or V2 by the switches SL(2)-SL($2^P$) of the switching circuit 134. In response to a first LSB control signal LSB1_CNTR, the switches SL(2)-SL($2^P$) connect the positive inputs 142(2)-142($2^P$) to either V1 or V2. In an example embodiment, LSB1_CNTR is generated by decoding the lower P bits of D_IN. The first interpolator circuit 140 interpolates between voltages V2 and V1 and provides a first interpolated voltage V_INT1 at the output 146.

The DAC 100 includes a second interpolator section 150 which has a switching circuit 154 comprising a plurality of switches, shown as switches SW(1)-SW($2^Q$), having respective outputs 156(1)-156($2^Q$). The switch SW(1) connects its output 156(1) to V_INT1. The remaining switches SW(2)-SW($2^Q$) can connect their respective outputs to either V2 or V1. For example, the switch SW(2) can connect to V2 in which case V2 appears at the output 156(2), or the switch SW(2) can connect to V1 in which case V1 appears at the output 156(2). The switch SW($2^Q$) can connect to V2 in which case V2 appears at the output 156($2^Q$), or the switch SL($2^Q$) can connect to V1 in which case V1 appears at the output 156($2^Q$).

The second interpolator section 150 includes a second LSB interpolator circuit 160 which interpolates between voltages V_INT1 (i.e., output of the first interpolator circuit 140) and V2. The second LSB interpolator circuit 160 includes a plurality of positive inputs 162(1)-162($2^Q$), negative inputs 164(1)-164($2^Q$), and an output 166. One of the positive inputs (e.g., 162(1)) is coupled to the output 146 of the first LSB interpolator circuit 140 via the switch SW(1), and as a result V_INT1 (output of the first interpolator circuit 140) is applied to the positive input 162(1). The other positive inputs 162(2)-162($2^Q$) are coupled to V1 or V2 via the switches SW(2)-SW($2^Q$), and the negative inputs 164(1)-164($2^Q$) are coupled to the output 166 (VOUT) of the second LSB interpolator circuit 160.

In response to a second LSB control signal LSB2_CNTR, the switches SW(2)-SW($2^Q$) connect the positive inputs 142(2)-142($2^Q$) to either V1 or V2. In an example embodiment, LSB2_CNTR is produced by decoding middle Q bits of D_IN. The second LSB interpolator circuit 160 linearly interpolates between V_INT1 and V2 and provides an output VOUT at the output 166.

Thus, in the example embodiment of FIG. 1, the digital input word D_IN is divided into three groups of sub-words: (1) M most significant bits; (2) middle Q bits; and (3) lower P bits. The string DAC section 104 provides a coarse representation of D_IN in response M most significant bits. Further interpolation is performed in two cascaded stages to provide greater granularity. The first interpolator section 130 interpolates between V2 and V1 in response to lower P bits and provides V_INTL and the second interpolator section 150 interpolates between V_INT1 and V2 in response to middle Q bits and provides an output VOUT.

Figure 2:
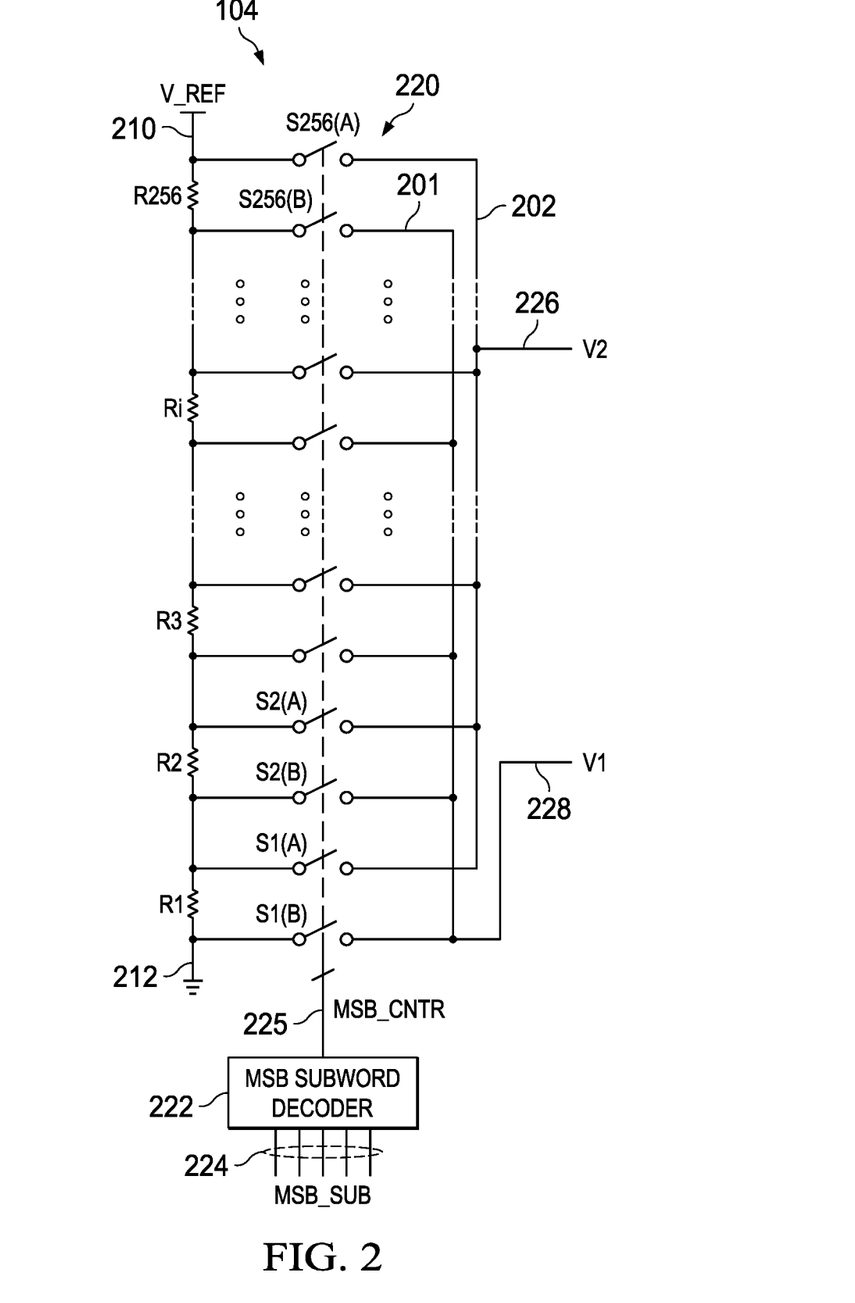
FIG. 2 is a schematic diagram of a string DAC section of an example embodiment.

FIG. 2 is a schematic diagram of the string DAC section 104 of an example embodiment. The string DAC section 204 includes $2^M$ resistors of equal resistance connected in series between a reference voltage terminal 210 and a ground terminal 212. In addition, string DAC section 104 includes ($2^M$+1) tap points, where one tap point is connected to reference voltage terminal 210, another is connected to common potential 212 and the other tap points are located between each of the resistors. For example, one terminal of switch S1(B) is connected to one tap point and one terminal of switches S1(A) and S2(B) are connected to another tap point. In this example, 256 resistors (R1-R256) are connected in series to convert 8 bits. The reference voltage terminal 210 can be coupled to a reference voltage V_REF and the ground terminal 212 can be coupled to an electrical ground.

The string DAC section 104 includes an MSB switching circuit 220 which has pairs of switches associated with the series connected resistors. Each pair of switches includes an upper switch and a lower switch. In the example of FIG. 2, switches S1(A) and S1(B) are associated with R1, switches S2(A) and S2(B) are associated with R2, and switches S256(A) and S256(B) are associated with R256. The upper switch S1(A) is associated with the upper terminal of R1 and the lower switch S1(B) is associated with the lower terminal of R1, the upper switch S2(A) is associated with the upper terminal of R2 and the lower switch S2(B) is associated with the lower terminal of R2, and the upper switch S256(A) is associated with the upper terminal of R256 and the lower switch S256(B) is associated with the lower terminal of R256.

The MSB switching circuit 220 includes an MSB decoder 222 which has an input 224 coupled to receive an MSB subword MSB_SUB which consists of a predetermined number of most significant bits of the digital input word. For example, MSB_SUB may consist of 8 most significant bits of a 16-bit D_IN.

The MSB decoder 222 decodes the MSB subword MSB_SUB and provides an MSB control signal MSB_CNTR, at an output 225, to control the switching of each switch in MSB switching circuit 220. In response to the MSB control signal MSB_CNTR, the MSB switching circuit 220 closes (e.g., causes the switches to conduct) only one of the pairs of the switches associated with a selected resistor and opens (e.g., causes the switches not to conduct) all other pairs of switches. The closed pair of switches couples the upper terminal of the selected resistor to an output 226 and couples the lower terminal of the selected resistor to an output 228. The effect of this is that a voltage (e.g., V2) at the upper terminal of the selected resistor appears at the output 226, and a voltage (e.g., V1) at the lower terminal of the selected resistor appears at the output 228. By closing any pair of the switches, voltages V2 and V1 at the upper and lower terminals, respectively, of the selected resistor are coupled to the respective outputs 226 and 228.

For example, if the MSB subword MSB_SUB consists of all 0s, the MSB switching circuit 220 closes the switches S1(A) and S1(B) which are associated with the resistor R1. Thus, V2 is equal to the voltage at the upper terminal of R1, and V1 is equal to the voltage at the lower terminal of R1. If the MSB subword MSB_SUB consists of all 1s, the MSB switching circuit 220 closes the switches S256(A) and S256(B) which are associated with the resistor R256. Thus, V2 is equal to the voltage at the upper terminal of R256 and V1 is equal to the voltage at the lower terminal of R256. Because voltage V1 is approximately close to the desired analog representation of the digital input word D_IN, V1 is referred to as a coarse representation of the digital input word.

Figure 3:
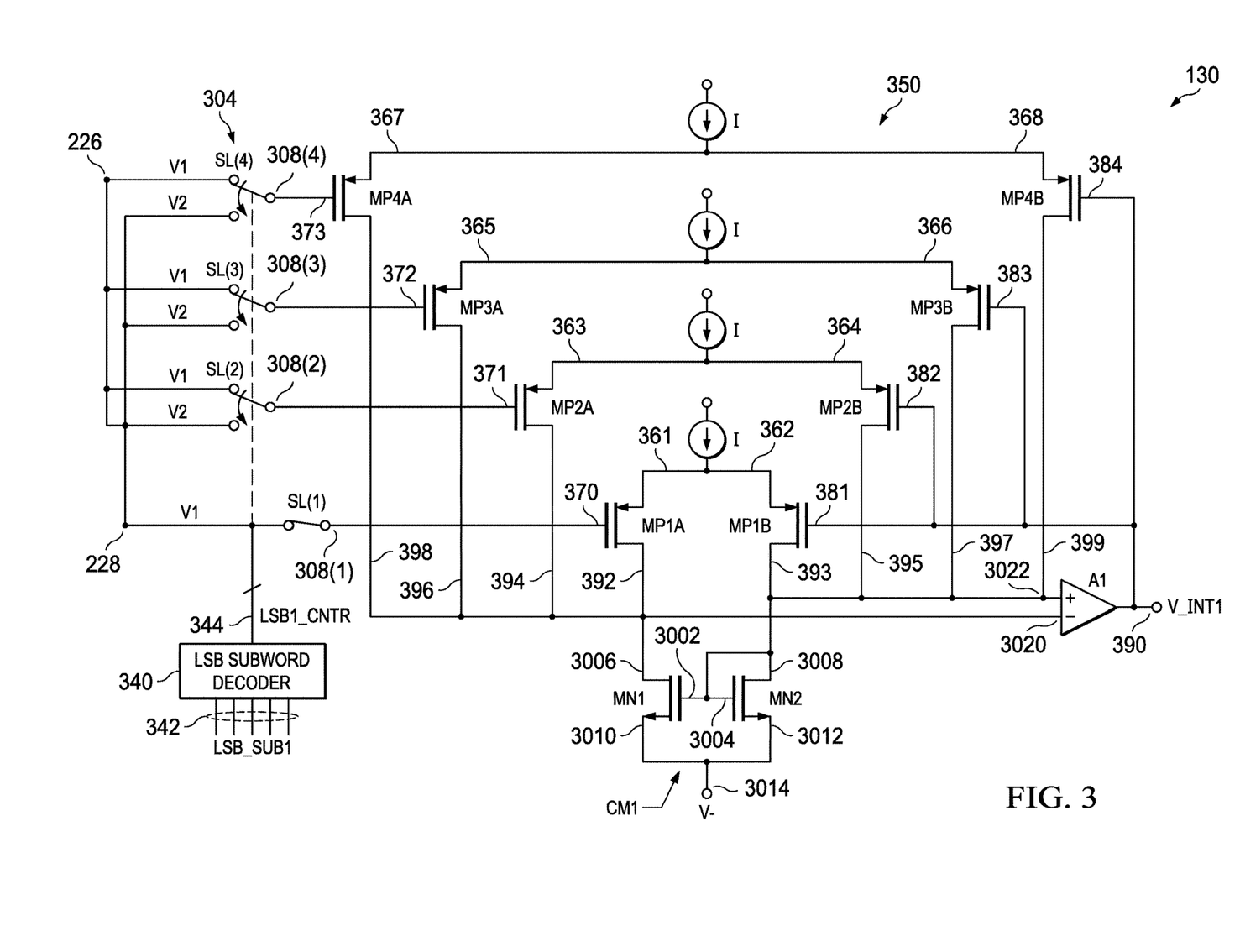
FIG. 3 is a schematic diagram of a first LSB interpolator section of an example embodiment.

FIG. 3 is a schematic diagram of the first LSB interpolator section 130 which interpolates between voltages V2 and V1. The first LSB interpolator section 130 includes a switching circuit 304 which has a plurality of switches SL(1)-SL($2^P$) having respective outputs. In the example of FIG. 3, P equals 2 (P=2) and, as such, the switching circuit 304 has four switches, SL(1)-SL(4) having respective outputs 308(1), 308(2), 308(3) and 308(4).

The switch SL(1) couples its output 308(1) to V1. The remaining switches SL(2)-SL(4) couple their respective outputs to either V2 or V1. For example, the switch SL(2) can couple the output 226 to output 308(2), which causes voltage V2 to appear at the output 308(2), or the switch SL(2) can couple the output 228 to output 308(2), which causes voltage V1 to appear at the output 308(2). The switch SL(3) can couple to the output 226 which causes voltage V2 to appear at the output 308(3), or the switch SL(2) can couple to the output 228 which causes voltage V1 to appear at the output 308(1).

The first LSB interpolator section 130 includes a first LSB decoder 340 which has an input 342 coupled to receive a first LSB subword LSB_SUB1. The first LSB decoder 340 decodes the first LSB subword LSB_SUB1 and provides a first LSB control signal LSB_CNTR1 at an output 344. In an example embodiment, the first LSB subword consists of lower P bits of the digital input word D_IN. In response to the first LSB control signal LSB_CNTR1, the switching circuit 304 closes the switches SL(2)-SL(4) to couple their respective outputs to V2 or V1.

The first LSB interpolator section 130 includes a first transconductance circuit 350 which has multiple differential stages. For an N-bit LSB subword, the transconductance circuit 350 includes identical or substantially identical differential stages. In other example embodiments, the differential stages can be binary-weighted.

In the example of FIG. 3, the transconductance circuit 350 has four differential stages (e.g., $2^P$ differential stages, where P is equal to two in this example) each including a pair of transistors. Transistors MP1A and MP1B form the first differential stage, transistors MP2A and MP2B form the second differential stage, transistors MP3A and MP3B form the third differential stage, and transistors MP4A and MP4B form the fourth differential stage. The transistors MP1A, MP1B, MP2A, MP2B, MP3A, MP3B, and MP4A, MP4B have respective first (current) terminals 361, 362, 363, 364, 365, 366, 367, 368 (e.g., sources) coupled to a current source I. In some example embodiments, the first terminals 361, 362, 363, 364, 365, 366, 367, 368 (e.g., sources) of the transistors may be connected to respective current sources (e.g., I1, I2, I3 . . . ), the current sources supplying currents having equal or unequal magnitudes.

One of the transistors MP1A of the differential stages has a control terminal 370 (e.g., gate) coupled via the switch SL(1) to the output 228 to receive V1. The transistors MP2A, MP3A, and MP4A have respective control terminals 371, 372, and 373 (e.g., gates) coupled to either the output 226 or 228 via the switches SL(2)-SL(4) to receive either V1 or V2. The transistors MP1B, MP2B, MP3B and MP4B have respective control terminals 381, 382, 383, and 384 (e.g., gates) coupled to an output 390.

Variations to the first LSB interpolator section 130 within the scope of the disclosures are possible. For example, in some embodiments the control terminal 370 (e.g., gate) of MP1A can be directly coupled to the output 228 without requiring the switch SL(1), and in those embodiments, the switching circuit 334 may include only three switches, instead of four switches as shown in FIG. 3.

The transistors MP1A, MP1B, MP2A, MP2B, MP3A, MP3B, and MP4A, MP4B have respective second (current) terminals 392, 393, 394, 395, 396, 397, 398 and 399 (e.g., drains) coupled to a current mirror circuit CM1.

In an example embodiment, the current mirror circuit CM1 includes transistors MN1 and MN2 which have respective control terminals (e.g., gates) 3002 and 3004 coupled together. The transistor MN1 has a first terminal 3006 (e.g., drain) coupled to the drains of the transistors MP1A-MP4A, and the transistor MN2 has a first terminal 3008 (e.g., drain) coupled to the drains of the transistors MP1B-MP4B. The control terminals 3002, 3004 of the transistors MN1, MN2 are also coupled to the first terminal 3008 of MN2. The transistors MN1 and MN2 have respective second terminals 3010 and 3012 (e.g., sources) coupled to a negative reference terminal 3014 which can be coupled to a negative voltage V−.

The first interpolator section 130 includes a feedback amplifier A1 which has an inverting input 3020, a non-inverting input 3022, and the output 390. The inverting input 3020 is coupled to the first terminal 3006 of the transistor MN1, and the non-inverting input 3022 is coupled to the first terminal 3008 of the transistor MN2. The output 390 is coupled to the control terminals of the transistors MN1B-MN4B. The transconductance stages and the current mirror CM1 provides a negative feedback path between the output 390 and the inverting input 3020 of the amplifier A1.

Initially, the first LSB subword may be [0, 0]. In response, the switches SL(2), SL(3) and SL(4) couple the control terminals 370, 371, 372, and 373 (e.g., gates) of the transistors MP1A, MP2A, MP3A, and MP4A, respectively, to V1. Because the drains 392, 394, 396, and 398 of MP1A, MP2A, MP3A and MP4A, respectively, are coupled to the drain 3006 of MN1, the sum of the currents through MP1A, MP2A, MP3A and MP4A flows through MN1. Also, because MN1 and MN2 are coupled in a current mirror configuration, the current through MN2 must be equal to the current through MN1. As a consequence, the voltages at the control terminals 381, 382, 383, and 384 (e.g., gates) of the transistors MP1B, MP2B, MP3B, and MP4B, respectively, must be equal to the voltages at the control terminals 370, 371, 372, and 373, respectively, of the transistors MP1A, MP2A, MP3A, and MP4A. Due to the negative feedback action of the amplifier A1, the voltages at the control terminals of MP1B, MP2B, MP3B and MP4B are set equal to the voltages at the control terminals of MP1A, MP2A, MP3A and MP4A. Thus, voltage V_INT1 at the output 390 of the amplifier A1 is equal to V1. In this case, the four differential stages of the transconductance circuit 350 are considered balanced.

Next, in response to an increment in the value of the first LSB subword from [0, 0] to [0, 1], one of the switches (e.g., switch SL(2)) couples the control terminal 371 (e.g., gate) of MP2A to V2. Thus, the control terminals (e.g., gates) of MP1A, MP3A and MP4A are coupled to V1 but the control terminal of MP2A is coupled to V2.

If, for example, V2 is 4 mV higher than V1, current through MP2A decreases, resulting in a decrease of current through MN1. Because current through MN2 must be equal to current through MN1 and due to the negative feedback action of the amplifier A1, the voltage V_INT1 at the output 390 increases which causes the sum of current through MP1B, MP2B, MP3B, MP3B to decrease. When the feedback action of A1 forces MN1 current to be equal to MN2, the sum of current through MP1A, MP2A, MP3A, MP4A is equal to MP1B, MP2B, MP3B, MP4B.

In response to another increment in the value of the first LSB subword to [1, 0], the switch SL(3) couples the control terminal 372 (e.g., gate) of MP3A to V2. Thus, the control terminals of MP2A and MP3A are both coupled to V2. If current through MN1 decreases, due to the negative feedback action of the amplifier A1, the voltage V_INT at the output 390 of the amplifier A1 will rise in order to reduce the total current flowing through MP1B, MP2B, MP3B and MP4B so the current flowing through MN2 is equal to the current flowing through MN1.

In response to yet another increment in the value of the first LSB subword to [1 1], the switch SL(4) couples the control terminal 373 (e.g., gate) of MP4A to V2. Thus, the control terminals of MP2A, MP3A, and MP4A are coupled to V2. If current through MN1 decreases, due to the negative feedback action of the amplifier A1, the voltage V_INT1 at the output 390 of the amplifier A1 will rise in order to reduce the total current flowing through the transistors MP1B, MP2B, MP3B and MP4B, so the current flowing through MN2 is equal to the current flowing through MN1. Thus, incrementing the first LSB subword leads to an increase of the voltage V_INT1 at the output 390.

Conversely, if, the first LSB subword is decremented from [1 1] to [1 0], the switch SL(4) couples the control terminal 373 (e.g., gate) of MP4A to V1. Thus, the control terminals (e.g., gates) of MP1A and MP4A are coupled to V1 but the control terminals of MP2A and MP3A are coupled to V2. As a result, the current though MP4A increases. Because the current flowing through MN2 must be equal to the current flowing through MN1 and due to the negative feedback action, the voltage V_INT1 at the output 390 of the amplifier A1 decreases, thus resulting in an increase in the sum of current through MP1B-MP4B until current through MN2 is equal to current through MN1.

If the first LSB subword is decremented from [1, 0] to [0, 1], the switch SL(3) couples the control terminal 372 (e.g., gate) of MP3A to V1. Thus, the control terminals of MP4A, MP3A and MP1A are coupled to V1 but the control terminal of MP2A is coupled to V2. As a result, the current though MP3A increases; thus resulting in an increase of the current through MN1. Because the current flowing through MN2 must be equal to the current flowing through MN1, the voltage V_INT1 at the output 390 of the amplifier A1 decreases so that current through MN2 is equal to current through MN1. Thus, decrementing the first LSB subword results in a decrease of the voltage V_INT1 at the output 390.

Figure 4:
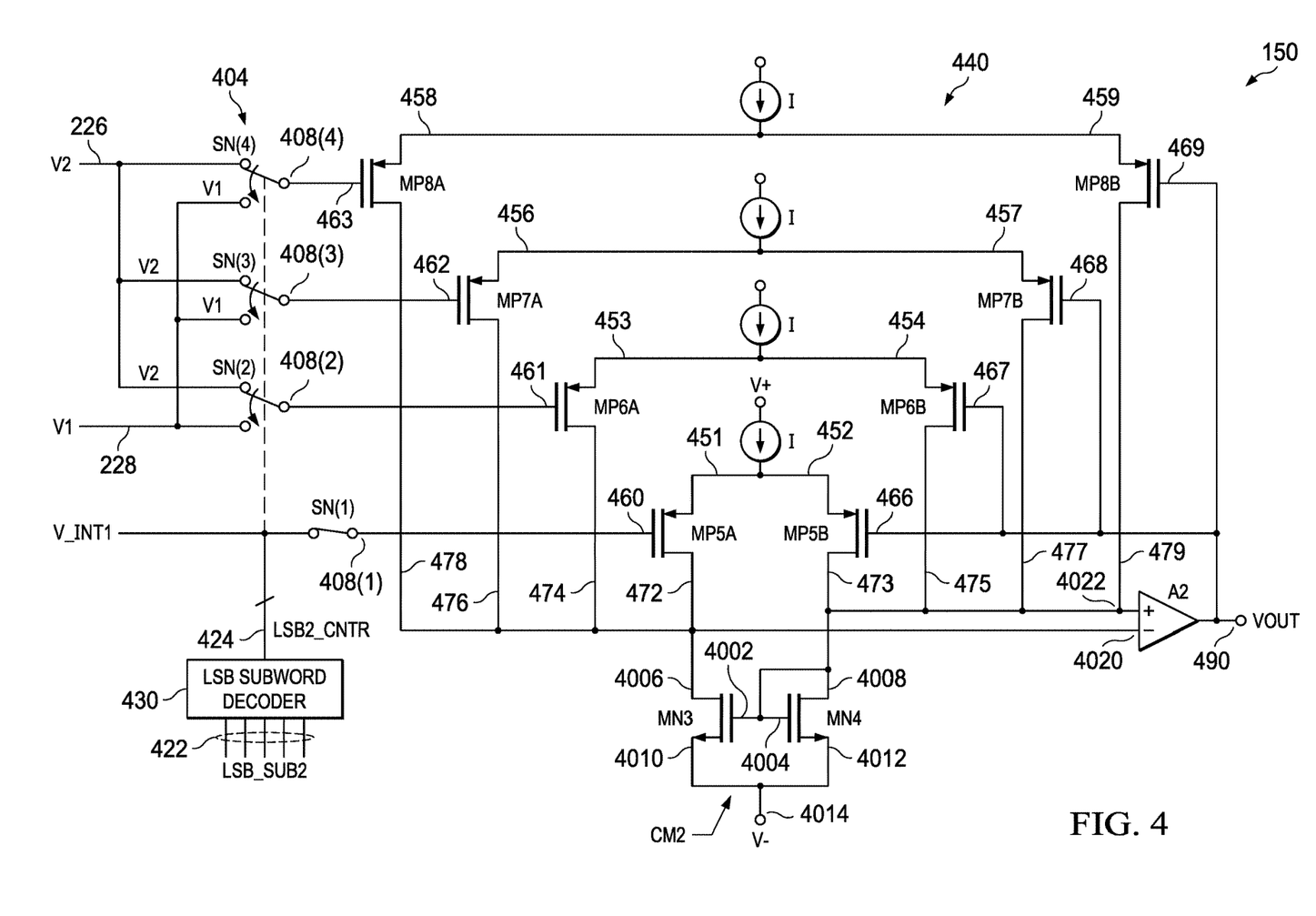
FIG. 4 is a schematic diagram of a second first LSB interpolator section of an example embodiment.

FIG. 4 is a schematic diagram of the second LSB interpolator section 150 which interpolates between voltages V2 and V_INT1. The second LSB interpolator section 150 includes a switching circuit 404 which includes a plurality of switches SN(1)-SN($2^Q$) having outputs 408(1)-408($2^Q$), respectively. In the example of FIG. 4, Q is equal to two (Q=2), so the switching circuit 404 has four switches, SN(1)-SN(4) having respective outputs 408(1), 408(2), 408(3) and 408(4).

The switches SN(1)-SN(4) are arranged such that SN(1) couples V_INT1 to its output 408(1). The remaining switches SN(2)-SN(4) can selectively connect their respective outputs to either V2 or V1. For example, the switch SN(2) can couple the output 226 to output 408(2) which causes voltage V2 to appear at the output 408(2), or the switch SN(2) can couple the output 228 to the output 408(2) which causes voltage V1 to appear at the output 408(2). The switch SN(3) can couple the output 226 to the output 408(3) which causes voltage V2 to appear at the output 408(3), or the switch SN(3) can couple the output 226 to the output 408(3) which causes voltage V1 to appear at the output 408(3).

The second LSB interpolator section 150 includes a second LSB decoder 430 which has an input 422 coupled to receive a second LSB subword LSB_SUB2. The second LSB decoder 430 decodes the second LSB subword LSB_SUB2 and provides a second LSB control signal LSB2_CNTR at an output 424. In an example embodiment, the second LSB subword consists of middle Q bits of the digital input word D_IN. In response to the second LSB control signal LSB2_CNTR, the switching circuit 404 closes the switches SN(2)-SN(4) to couple their respective outputs to V2 or V1.

The second LSB interpolator section 150 includes a second transconductance circuit 440 which has multiple differential stages. For Q-bit LSB subword, the second transconductance circuit 440 includes $2^Q$ differential stages. In some example embodiments, the differential stages can be binary-weighted or they can be identical, substantially identical or not identical.

In the example of FIG. 4, the transconductance circuit 440 has $2^Q$ differential stages (e.g., there would be four differential stages where Q is equal to 2), each including a pair of transistors. Transistors MP5A and MP5B form the first differential stage, transistors MP6A and MP6B form the second differential stage, transistors MP7A and MP7B form the third differential stage, and transistors MP8A and MP8B form the fourth differential stage. The transistors MP5A, MP5B, MP6A, MP6B, MP7A, MP7B, and MP8A, MP8B have respective first (current) terminals 451, 452, 453, 454, 456, 457, 458, 459 (e.g., sources) coupled to the current source I. In some example embodiments, the first terminals 451, 452, 453, 454, 456, 457, 458, 459 (e.g., sources) of the transistors may be connected to respective current sources (e.g., I1, I2, I3, I4), each of the current sources supplying currents may have equal or unequal magnitudes.

One of the transistors MP5A of the differential stages has a control terminal 460 (e.g., gate) coupled via the switch SN(1) to receive V_INT1. The transistors MP6A, MP7A, and MP8A have respective control terminals 461, 462, and 463 (e.g., gates) coupled to either the output 226 or 228 via the switches SN(2)-SN(4) to receive either V2 or V1, respectively. The transistors MP5B, MP6B, MP7B and MP8B have respective control terminals 466, 467, 468, and 469 (e.g., gates) coupled to an output 490 of the second LSB interpolator section 440.

Variations to the second LSB interpolator section 150 within the scope of the disclosures are possible. For example, in some embodiments the control terminal 460 (e.g., gate) of MP5A can be directly coupled to the output 228 without requiring the switch SN(1), and in those embodiments, the switching circuit 404 includes three switches, instead of four switches as shown in FIG. 4.

The transistors MP5A, MP5B, MP6A, MP6B, MP7A, MP7B, and MP8A, MP8B have respective second (current) terminals 472, 473, 474, 475, 476, 477, 478 and 479 (e.g., drains) coupled to a current mirror circuit CM2.

In an example embodiment, the current mirror circuit CM2 includes transistors MN3 and MN4 which have respective control terminals (e.g., gates) 4002 and 4004 coupled together. The transistor MN3 has a first terminal 4006 (e.g., drain) coupled to the drains of the transistors MP5A-MP8A, and the transistor MN3 has a first terminal 4008 (e.g., drain) coupled to the drains of the transistors MP5B-MP6B. The control terminals 4002, 4004 of the transistors MN3, MN4 are also coupled to the first terminal 4008 of MN4. The transistors MN3 and MN4 have respective second terminals 4010 and 4012 (e.g., sources) coupled to a negative reference terminal 4014 which can be coupled to a negative voltage V−.

The second interpolator section 150 includes a feedback amplifier A2 which has an inverting input 4020, a non-inverting input 4022, and the output 490. The inverting input 4020 is coupled to the first terminal 4006 of the transistor MN3, and the non-inverting input 4022 is coupled to the first terminal 4008 of the transistor MN4. The output 490 is coupled to the control terminals of the transistors MN5B-MN8B. The transconductance stages and the current mirror CM2 provide a negative feedback path between the output 490 and the inverting input 4020.

The operation of the second LSB interpolation section 150 is similar to the operation of the first LSB interpolation section. In response to the second LSB subword LSB_SUB2, the second LSB interpolation section 150 interpolates a voltage between V_INT1 and V2 and provides an output VOUT at the output 490.

In an example embodiment, the outputs of the first and second interpolation sections V_INT1 and VOUT, respectively, can be expressed by the equations:

$$V\_INT1 = V1 + p*(Vref/2^{M+P}) \quad (1)$$

$$VOUT = V1 + (q*2^P + p)*\frac{Vref}{2^{(M+P+Q)}} \quad (2)$$

where, p=0, 1, ..., $2^P$−1; q=0, 1, ..., $2^Q$−1; M represents the most significant bits of the digital input word, Q represents the middle least significant bits of the digital input word, and P represents the lower least significant bits of the digital input word.

The DAC 100, in accordance with disclosed embodiments, provides several advantages over currently existing DACs. From the above equation, the output voltage of the DAC 100 is the sum of a coarse component (V1) and an interpolated component $$\left((q*2^P + p)*\frac{Vref}{2^{(M+P+Q)}}\right).$$

The interpolated component includes the $2^{(M+P+Q)}$ as the denominator, so the DAC 100 provides a higher resolution at the output. In contrast, in existing DACs, the interpolated component includes the $2^{(M+Q)}$ as the denominator, which leads to a lower resolution at the output.

An additional advantage of the DAC 100 is that the area required to build the DAC 100 in an integrated circuit is much less than the area required to build existing DACs. An existing 16-bit DAC may include a 7-bit string DAC section and a 9-bit single interpolator section. Thus, the single interpolator section requires 512 ($2^9$) differential stages which can consume a relatively large area in an integrated circuit. In contrast, the DAC 100 in accordance with the disclosed embodiments includes two cascaded interpolator sections: the first interpolator section 130 and the second interpolator section 150. If the first interpolator section 130 is a 5-bit interpolator and the second interpolator section 150 is a 4-bit interpolator, the total number of differential stages required is 48 ($2^5+2^4$). Thus, the DAC 100 substantially reduces the required number of differential stages, which leads to a substantial reduction in the area required to implement the DAC 100 in an integrated circuit.

A further advantage of the DAC 100 is that the first interpolator section 130 and the second interpolator section 150 are independent from one another. Thus, the first and the second interpolator sections, 130 and 150, can be optimized independently based on the application.

In accordance with the principles disclosed above, the DAC 100 can be configured to include more than two interpolator sections. Thus, although the DAC 100 of an example embodiment is shown to include the first and the second interpolator sections, 130 and 150, the DAC 100 can be modified to include three or more interpolator sections.

In this description, the term "couple" may cover connections, communications, or signal paths that enable a functional relationship consistent with this description. For example, if device A provides a signal to control device B to perform an action, then: (a) in a first example, device A is coupled to device B; or (b) in a second example, device A is coupled to device B through intervening component C if intervening component C does not substantially alter the functional relationship between device A and device B, such that device B is controlled by device A via the control signal provided by device A. Also, in this description, a device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof. Furthermore, in this description, a circuit or device that includes certain components may instead be adapted to be coupled to those components to form the described circuitry or device. For example, a structure described as including one or more semiconductor elements (such as transistors), one or more passive elements (such as resistors, capacitors and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, such as by an end-user and/or a third party.

As used herein, the terms "terminal", "node", "interconnection" and "pin" are used interchangeably. Unless specifically stated to the contrary, these terms are generally used to mean an interconnection between or a terminus of a device element, a circuit element, an integrated circuit, a device or other electronics or semiconductor component.

While the use of particular transistors are described herein, other transistors (or equivalent devices) may be used instead with little or no change to the remaining circuitry. For example, a metal-oxide-silicon FET ("MOSFET") (such as an n-channel MOSFET, nMOSFET, or a p-channel MOSFET, pMOSFET), a bipolar junction transistor (BJT—e.g. NPN or PNP), insulated gate bipolar transistors (IGBTs), and/or junction field effect transistor (JFET) may be used in place of or in conjunction with the devices disclosed herein. The transistors may be depletion mode devices, drain-extended devices, enhancement mode devices, natural transistors or other type of device structure transistors. Furthermore, the devices may be implemented in/over a silicon substrate (Si), a silicon carbide substrate (SiC), a gallium nitride substrate (GaN) or a gallium arsenide substrate (GaAs).

While certain components may be described herein as being of a particular process technology, these components may be exchanged for components of other process technologies. Circuits described herein are reconfigurable to include the replaced components to provide functionality at least partially similar to functionality available before the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in series or in parallel between the same two nodes as the single resistor or capacitor. Also, uses of the phrase "ground" in this description include a chassis ground, an Earth ground, a floating ground, a virtual ground, a digital ground, a common ground, and/or any other form of ground connection applicable to, or suitable for, the teachings of this description. Unless otherwise stated, "about", "approximately", or "substantially" preceding a value means+/−10 percent of the stated value.

While certain elements may be included in an integrated circuit and other elements are external to the integrated circuit, additional or fewer features may be incorporated into the integrated circuit in other example embodiments. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Modifications are possible in the described embodiments, and other embodiments are possible, within the scope of the claims.

What is claimed is:

1. A digital-to-analog converter (DAC) for converting a digital input word to an analog output signal, the DAC comprising:
   a string DAC comprising:
      a plurality of series-connected resistors; and
      a most significant bit (MSB) switching circuit including pairs of switches, each pair of switches having an upper switch and a lower switch, each upper switch is connected to an upper terminal of one of the plurality of series-connected resistors and each lower switch is connected to a lower terminal of one of the plurality of series-connected resistors, the MSB switching circuit operable to provide a first voltage and a second voltage in response to an MSB control signal;

a first least significant bit (LSB) interpolator coupled to the string DAC and having an output, a plurality of non-inverting inputs and a plurality of inverting inputs coupled to the output, one of the non-inverting inputs coupled to receive the first voltage and the other non-inverting inputs coupled to receive the first or the second voltage, the first LSB interpolator operable to provide a first interpolated voltage at the output in response to a first LSB control signal; and a second LSB interpolator coupled to the string DAC and the first LSB interpolator, the second LSB interpolator having an output, a plurality of non-inverting inputs and a plurality of inverting inputs coupled to the output, one of the non-inverting inputs coupled to receive the first interpolated voltage and the other non-inverting inputs coupled to receive the first voltage or the second voltage, the second LSB interpolator operable to provide an output voltage at the output in response to a second LSB control signal.

2. The DAC 100 of claim 1, wherein the string DAC comprises a MSB decoder having an input coupled to receive a MSB subword and operable to provide the MSB control signal by decoding the MSB subword.

3. The DAC of claim 2, wherein the MSB subword comprises M most significant bits of the digital input word, where M is an integer.

4. The DAC of claim 1, wherein the first interpolator comprises a first LSB decoder having an input coupled to receive a first LSB subword and operable to provide the first LSB control signal by decoding the first LSB subword.

5. The DAC of claim 4, wherein the first LSB subword comprises lower P least significant bits of the digital input word.

6. The DAC of claim 1, wherein the second interpolator comprises a second LSB decoder having an input coupled to receive a second LSB subword and operable to provide the second LSB control signal by decoding the second LSB subword.

7. The DAC of claim 6, wherein the second LSB subword comprises middle Q least significant bits of the digital input word.

8. The DAC of claim 1, wherein the MSB switching circuit is operable to close one of the pair of switches to provide the first and second voltages.

9. A digital-to-analog converter (DAC) for converting a digital input word to an analog output signal, the DAC comprising:

a first least significant bit (LSB) interpolator circuit having an output, a plurality of non-inverting inputs, and a plurality of inverting inputs coupled to the output, one of the non-inverting inputs adapted to receive a coarse representation voltage, the other non-inverting inputs adapted to receive the coarse representation voltage or a second voltage higher than the coarse representation voltage, the first LSB interpolator circuit operable to provide a first interpolated voltage at the output; and a second LSB interpolator circuit coupled to the first LSB interpolator circuit and having an output, a plurality of non-inverting inputs, and a plurality of inverting inputs coupled to the output, one of the non-inverting inputs adapted to receive the first interpolated voltage, and the other non-inverting inputs adapted to receive the coarse representation voltage or the second voltage, the second LSB interpolator circuit operable to provide an output voltage.

10. The DAC of claim 9, wherein the first LSB interpolator circuit is adapted to receive a first LSB subword and operable to provide the first interpolated voltage responsive to the first LSB subword.

11. The DAC of claim 9, wherein the second LSB switching circuit is adapted to receive a second LSB subword and operable to provide the output voltage responsive to the second LSB subword.

12. The DAC of claim 9, wherein the first interpolator circuit comprises:

a first transconductance circuit having a plurality of first and second transistors having respective first terminals adapted to receive tail currents and having respective second terminals and control terminals, one the control terminals of the first transistors adapted to be coupled to receive the coarse representation voltage and the other control terminals of the first transistors adapted to receive the coarse representation voltage or the second voltage;

a first current mirror circuit having third and fourth transistors having respective first, second, and control terminals, the first terminal of the third transistor coupled to the second terminals of the plurality of first transistors and the first terminal of the fourth transistor coupled to the second terminals of the plurality of second transistors, the control terminals of the third and fourth transistors coupled to the first terminal of the fourth transistor, and the second terminals of the third and fourth transistors coupled to a negative reference terminal; and a first feedback amplifier having an inverting input coupled to the first terminal of the third transistor and having a non-inverting input coupled to the first terminal of the fourth transistor, the first feedback amplifier having an output coupled to the control terminals of the second transistors, the first feedback amplifier providing the first interpolated voltage at the output.

13. The DAC of claim 9, wherein the second interpolator circuit comprises:

a second transconductance circuit having a plurality of fifth and sixth transistors having respective first terminals adapted to receive tail currents and having respective second terminals and control terminals, one the control terminals of the fifth transistors coupled to receive the first interpolated voltage and the other control terminals of the fifth transistors adapted to receive the coarse representation voltage or the second voltage;

a second current mirror circuit having seventh and eighth transistors having respective first, second, and control terminals, the first terminal of the seventh transistor coupled to the second terminals of the plurality of fifth transistors and the first terminal of the eighth transistor coupled to the second terminals of the plurality of sixth transistors, the control terminals of the seventh and eighth transistors coupled to the first terminal of the eighth transistor, and the second terminals of the seventh and eights transistors coupled to a negative reference terminal; and a second feedback amplifier having an inverting input coupled to the first terminal of the seventh transistor and having a non-inverting input coupled to the first terminal of the eighth transistor, the first feedback amplifier having an output coupled to the control terminals of the plurality of second transistors, the first feedback amplifier providing the output voltage.

14. A digital-to-analog converter (DAC) for converting a digital input word to an analog output signal, the DAC comprising:
   a string DAC comprising:
      a plurality of series-connected resistors; and
      a most significant bit (MSB) switching circuit including pairs of switches, each pair of switches having an upper switch and a lower switch, each upper switch is connected to an upper terminal of one of the plurality of series-connected resistors and each lower is connected to a lower terminal of one of the plurality of series-connected resistors, the MSB switching circuit operable to provide a first voltage and a second voltage in response to M most significant bits of the digital input word;
   a first least significant bit (LSB) interpolator coupled to the string DAC and having an output and a plurality of inputs, one of the inputs coupled to receive the first voltage and the other inputs adapted to receive the first or the second voltage, the first LSB interpolator operable to interpolate between the first and second voltages in response to lower P least significant bits of the digital input word and provide a first interpolated voltage; and
   a second least significant bit (LSB) interpolator coupled to the string DAC and the first LSB interpolator, the second LSB interpolator having an output and a plurality of inputs, one of the inputs coupled to receive the first interpolated voltage, and the other inputs adapted to receive the first or second voltages, the second LSB circuit operable to provide an output voltage at the output in response to middle Q least significant bits of the digital input word.

15. The DAC of claim 14, wherein the first LSB interpolator comprises a first transconductance circuit having a plurality of first and second transistors having respective first terminals adapted to receive tail currents and having respective second terminals and control terminals, one the control terminals of the first transistors coupled to receive the first voltage and the other control terminals of the first transistors coupled to receive the first or the second voltage.

16. The DAC of claim 14, wherein the first LSB interpolator comprises a first current mirror circuit having third and fourth transistors having respective first, second, and control terminals, the first terminal of the third transistor coupled to the second terminals of the plurality of first transistors and the first terminal of the fourth transistor coupled to the second terminals of the plurality of second transistors, the control terminals of the third and fourth transistors coupled to the first terminal of the fourth transistor, and the second terminals of the third and fourth transistors coupled to a negative reference terminal.

17. The DAC of claim 14, wherein the first LSB interpolator comprises a first feedback amplifier having an inverting input coupled to the first terminal of the third transistor and having a non-inverting input coupled to the first terminal of the fourth transistor, the first feedback amplifier having an output coupled to the control terminals of the second transistors, the first feedback amplifier operable to provide the first interpolated voltage at the output.

18. The DAC of claim 14, wherein the second interpolator comprises a second transconductance circuit having a plurality of fifth and sixth transistors having respective first terminals adapted to receive tail currents and having respective second terminals and control terminals, one the control terminals of the fifth transistors coupled to receive the first interpolated voltage and the other control terminals of the fifth transistors coupled to receive the first or the second voltage.

19. The DAC of claim 18, wherein the second interpolator comprises a second current mirror circuit having seventh and eighth transistors having respective first, second, and control terminals, the first terminal of the seventh transistor coupled to the second terminals of the plurality of fifth transistors and the first terminal of the eighth transistor coupled to the second terminals of the plurality of sixth transistors, the control terminals of the seventh and eighth transistors coupled to the first terminal of the eighth transistor, and the second terminals of the seventh and eights transistors coupled to a negative reference terminal.

20. The DAC of claim 19, wherein the second interpolator comprises a second feedback amplifier having an inverting input coupled to the first terminal of the seventh transistor and having a non-inverting input coupled to the first terminal of the eighth transistor, the first feedback amplifier having an output coupled to the control terminals of the plurality of second transistors, the first feedback amplifier operable to provide the output voltage.

21. A digital-to-analog converter (DAC) comprising:
   a first DAC section configured to provide signals at first and second outputs responsive to most significant bits of a digital input word, the first DAC section including:
      resistors coupled in series between a reference voltage terminal and a common potential terminal, each resistor having first and second terminals; and
      a first switching circuit coupled to the resistors, the first switching having the first and second outputs;
   a first least significant bit (LSB) interpolator having first noninverting inputs, first inverting inputs, and an output, the first noninverting inputs coupled to the first and second outputs of the first DAC section, the first inverting inputs coupled to the output of the first LSB interpolator, the first LSB interpolator configured to provide a first voltage at the output of the first LSB interpolator responsive to first LSBs of the digital word; and
   a second LSB interpolator having second noninverting inputs, second inverting inputs, and an output, one of the second noninverting inputs coupled to the output of the first LSB interpolator, the other of second noninverting inputs coupled to the first and second outputs of the first DAC section, the second inverting inputs coupled to the output of the second LSB interpolator, the second LSB interpolator configured to provide a second voltage at the output of the second LSB interpolator responsive to second LSBs of the digital word.

22. A digital-to-analog converter (DAC) comprising:
   a first least significant bit (LSB) interpolator having first noninverting inputs, first inverting inputs, and an output, the first inverting inputs coupled to the output of the first LSB interpolator, the first LSB interpolator configured to provide a first voltage at the output of the first LSB interpolator responsive to first LSBs of a digital word; and
   a second LSB interpolator having second noninverting inputs, second inverting inputs, and an output, one of the second noninverting inputs coupled to the output of the first LSB interpolator, the second inverting inputs coupled to the output of the second LSB interpolator, the second LSB interpolator configured to provide a second voltage at the output of the second LSB interpolator responsive to second LSBs of the digital word.

* * * * *